(12) United States Patent
Bapat (10) Patent No.: US 7,315,972 B1
(45) Date of Patent: Jan. 1, 2008

(54) METHOD AND APPARATUS FOR AUTOMATED GENERATION OF EXPECTED VALUE DATA FOR CIRCUIT DESIGNS

(75) Inventor: Shekhar Bapat, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 445 days.

(21) Appl. No.: 10/850,184

(22) Filed: May 20, 2004

(51) Int. Cl.
*G01R 31/28* (2006.01)
(52) U.S. Cl. .................. 714/741; 714/736
(58) Field of Classification Search .......... 714/725, 714/41, 6, 741, 736; 703/15
See application file for complete search history.

(56) References Cited

U.S. PATENT DOCUMENTS

| | | | | |
|---|---|---|---|---|
| 4,225,957 | A * | 9/1980 | Doty et al. ............ | 714/725 |
| 5,263,149 | A * | 11/1993 | Winlow ............... | 703/15 |
| 6,493,841 | B1 * | 12/2002 | Kim et al. ............ | 714/741 |
| 6,889,368 | B1 * | 5/2005 | Mark et al. ........... | 716/4 |
| 7,085,702 | B1 * | 8/2006 | Hwang et al. ......... | 703/15 |

OTHER PUBLICATIONS

Xilinix, Inc.; XAPP138, "Virtex FPGA Series Configuration and Readback"; (v2.7); Jul. 11, 2002; available from Xilinx, Inc., 2100 Logic Drive, San Jose, CA 95124; pp. 1-39.
Xilinx, Inc.; XAPP139, "Configuration and Readback of Virtex FPGAs Using (JTAG) Boundary Scan"; (v1.6; Sep. 12, 2003; available from Xilinx, Inc., 2100 Logic Drive, San Jose, CA 95124; pp. 1-17.

* cited by examiner

*Primary Examiner*—David Ton
(74) *Attorney, Agent, or Firm*—Robert Brush (57) ABSTRACT

Method and apparatus for generating expected value data for testing a circuit configured in a programmable logic device (PLD). A simulation model is generated from a circuit representation for the circuit. Nodes in the simulation model configured for readback capture are automatically identified. The circuit representation is simulated as defined by the simulation model. Expected value data is recorded during the simulation in response to the identified nodes. A method and apparatus for testing a circuit configured in a PLD is also described. Expected value data for components of a circuit representation for the circuit is automatically generated using a modeling system, where the components are configured for readback capture. A test stimulus is applied to the circuit and state data is captured. The captured state data is compared with the expected value data.

21 Claims, 5 Drawing Sheets

METHOD AND APPARATUS FOR AUTOMATED GENERATION OF EXPECTED VALUE DATA FOR CIRCUIT DESIGNS

FIELD OF THE INVENTION

One or more aspects of the present invention relate generally to testing programmable logic devices and, more particularly, to a method and apparatus for automated generation of expected value data for circuit designs.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

An important step in the manufacture of PLDs is testing the PLDs prior to shipment to a customer. One process for testing a PLD configures the PLD with a test circuit design (also referred to as a test pattern). The test circuit design is configured to test particular resources of the PLD. A test stimulus is applied to the inputs of the test circuit design, and the outputs of the test circuit design are analyzed to capture the resulting state data. The state data is compared with the expected values of the state data to determine whether the test circuit design functioned properly.

Presently, designers generate the expected values for a given test pattern by hand. However, depending on the type of resources being tested, the generation of the expected values by hand may be impractical. For example, the resource under test may be a lookup table (LUT), which can be programmed to implement any one of a multiplicity of different functions (e.g., 65,536 different functions for a LUT having 16 inputs). A LUT may be tested by providing all possible input combinations and testing the output for each input combination. Thus, expected values must be computed for each possible input combination. The problem is further exacerbated if a given test pattern is designed to test multiple LUTS. Accordingly, there exists a need in the art for a method and apparatus that automatically generates expected value data for a circuit design.

SUMMARY OF THE INVENTION

One aspect of the invention relates to a method and apparatus for generating expected value data for testing a circuit configured in a programmable logic device (PLD). In one embodiment, a simulation model is generated from a circuit representation for the circuit. Nodes in the simulation model configured for readback capture in the PLD are automatically identified. The circuit representation is simulated as defined by the simulation model. Expected value data is recorded during the simulation in response to the identified nodes.

Another aspect of the invention relates to a method and apparatus for testing a circuit configured in a PLD. In one embodiment, expected value data for components of a circuit representation for the circuit is automatically generated using a modeling system. The components are configured for readback capture in the PLD. A test stimulus is applied to the circuit. State data is captured from the PLD in response to the test stimulus. The captured state data is compared with the expected value data.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
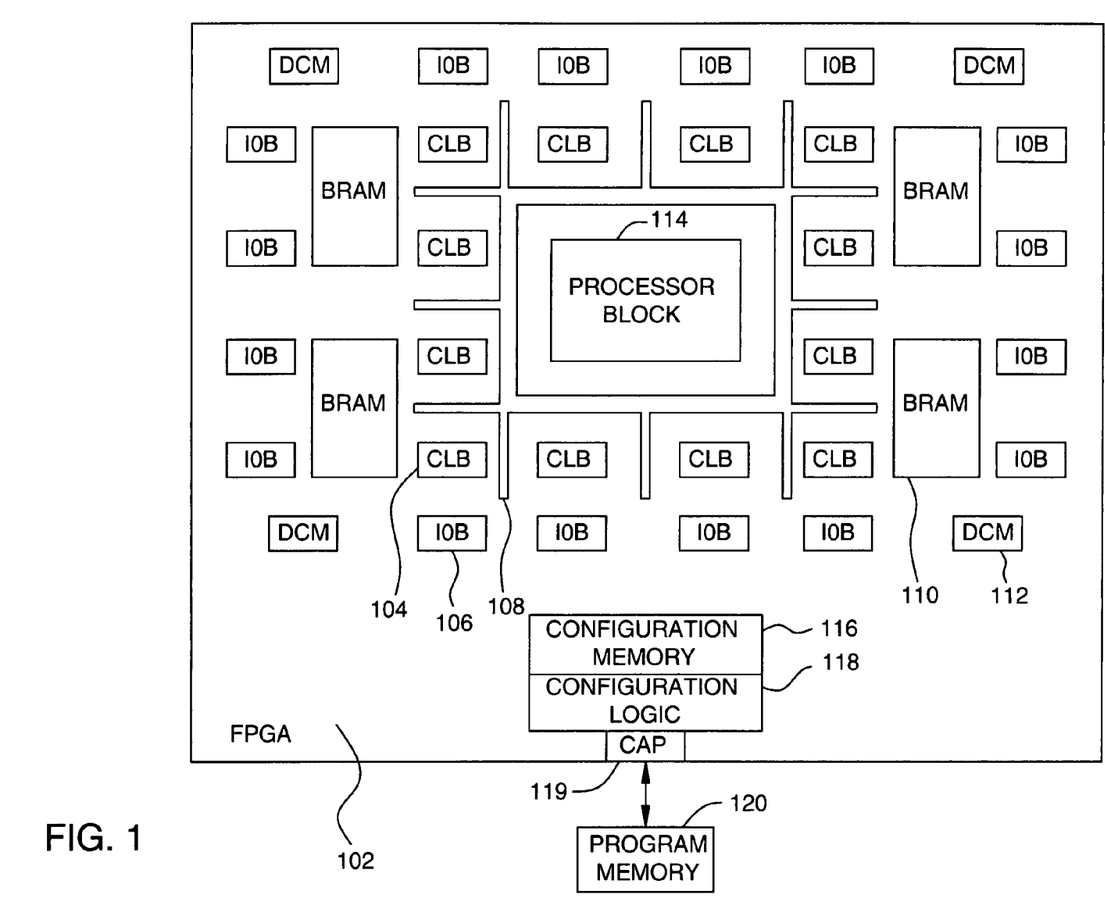
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also referred to as "programmable logic"), as well as configuration memory 116 for determining the functionality of the FPGA 102. The FPGA 102 may also include various dedicated internal logic circuits, illustratively shown as blocks of random access memory ("BRAM 110"), configuration logic 118, digital clock management (DCM) blocks 112, and an embedded processor block 114. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and controls configuration of, the configuration memory 116. A configuration bitstream produced from the program memory 120 may be coupled to the configuration logic 118 through a configuration port 119. The configuration process of FPGA 102 is also well known in the art.

Notably, memory cells in the configuration memory 116 that are not used to store configuration information may be used as "readback capture cells." The readback capture cells may be used to "shadow" particular components in the slices of the CLBs 104 (e.g., flip-flops). In response to a capture signal, the states of the shadowed components are loaded into the readback capture cells (i.e., the unused memory cells of the configuration memory 116). State data stored in the readback capture cells may be extracted after readback of the configuration memory 116. The readback mechanism for FPGAs is well known in the art (see for example Xilinx Application Note: "Virtex FPGA Series Configuration and Readback", XAPP138 (v2.7) Jul. 11, 2002, published by Xilinx Inc. of San Jose Calif., which is herein incorporated by reference).

The DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBS, 16 IOBs, 4 BRAMS, 4 DCMs, and one processor block. Those skilled in the art will appreciate that actual FPGAs may include different numbers of such components in any number of different ratios. For example, the FPGA 102 may be selected from the VIRTEX-II PRO family of products, commercially available from Xilinx, Inc. of San Jose, Calif.

Figure 2:
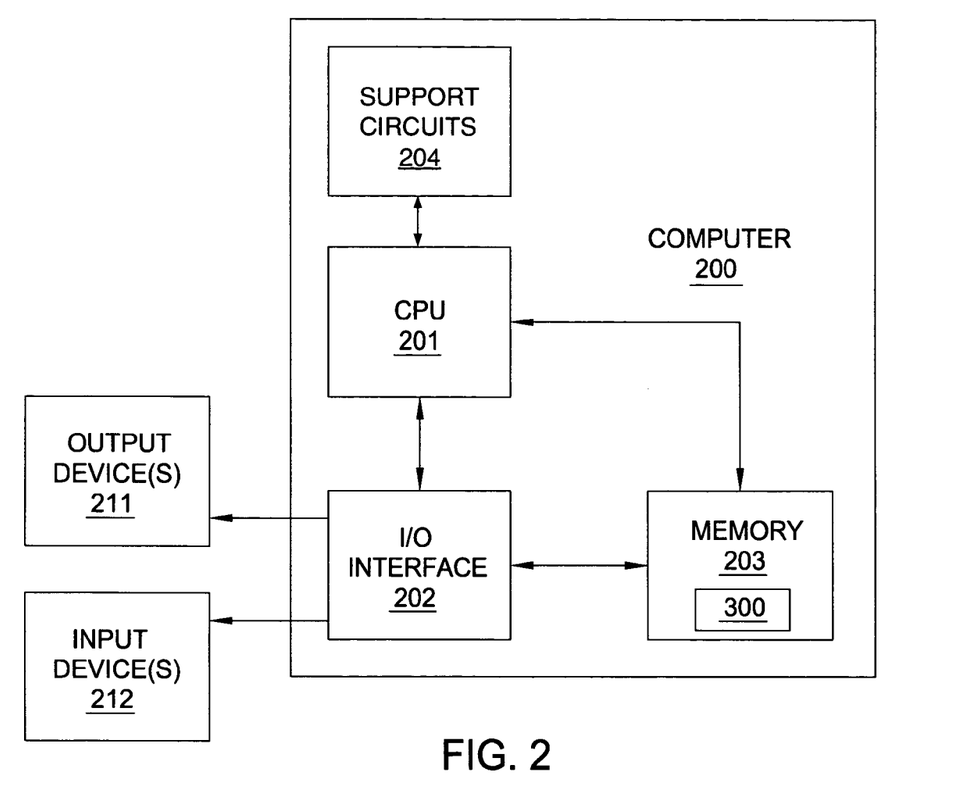
FIG. 2 is a block diagram depicting an exemplary embodiment of a computer suitable for implementing the processes and methods described herein.

FIG. 2 is a block diagram depicting an exemplary embodiment of a computer 200 suitable for implementing the processes and methods described herein. The computer 200 includes a central processing unit (CPU) 201, a memory 203, various support circuits 204, and an I/O interface 202. The CPU 201 may be any type of microprocessor known in the art. The support circuits 204 for the CPU 201 include conventional cache, power supplies, clock circuits, data registers, I/O interfaces, and the like. The I/O interface 202 may be directly coupled to the memory 203 or coupled through the CPU 201. The I/O interface 202 may be coupled to various input devices 212 and output devices 211, such as a conventional keyboard, mouse, printer, display, and the like.

The memory 203 may store all or portions of one or more programs and/or data to implement the processes, methods, and design tools described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 200 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 203. The memory 203 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Figure 3:
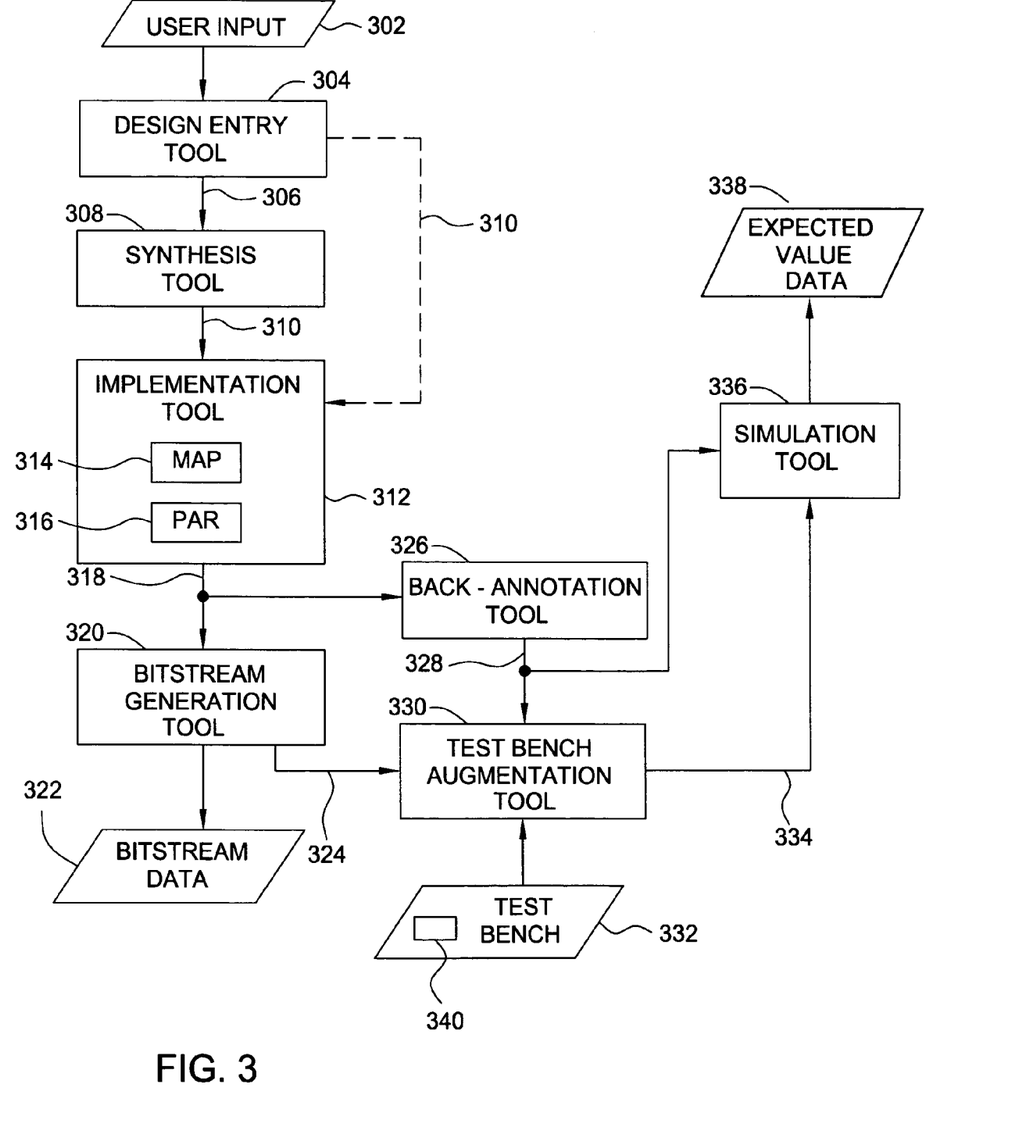
FIG. 3 is a block diagram depicting an exemplary embodiment of a modeling system constructed in accordance with the invention.

FIG. 3 is a block diagram depicting an exemplary embodiment of a modeling system 300 constructed in accordance with the invention. The modeling system 300 comprises a design entry tool 304, a synthesis tool 308, an implementation tool 312, a back-annotation tool 326, a bitstream generation tool 320, a simulation tool 336, and a test bench augmentation tool 330. The modeling system 300 may be implemented using the computer 200 shown in FIG. 2. Notably, the tools may be part of one or more software programs stored in the memory 203 and configured for execution by the CPU 201.

The modeling system 300 is configured to generate bitstream data 322 for a target FPGA device in response to a circuit design input by a user. The circuit design is configured to test one or more resources of the target FPGA (e.g., flip-flops, memory, LUTS, and the like). Such a circuit design is also referred to as a "test pattern". The modeling system 300 is further configured to generate expected value data 338 for use in testing a circuit configured in the FPGA in accordance with the circuit design. For purposes of clarity by example, the modeling system 300 is described with specific reference to an FPGA. It is to be understood, however, that the modeling system 300 may be adapted for use with other types of PLDS, such as CPLDs.

In particular, the design entry tool 304 is configured to receive user input 302 and generate a functional description of the circuit design ("functional design data 306"). The circuit design includes a plurality of circuit components, such as flip-flops, memories, LUTS, and the like, connected together via signal conductors ("nets"). The term "components" as used herein is meant to encompass both circuit components and nets. Various components of the circuit design may be associated with particular identifiers ("tags"). The value given a particular tag is typically set by the user, although such value may be set by the design entry tool 304. For example, a two-input OR gate in the first instance of a multiplexer in a four-bit counter may be associated with a tag with a hierarchical syntax of:

"/Acc/a1u_1/mult_4/8count_3/4bit_0/mux_1/or2".

Those skilled in the art will appreciate that other types of syntax may be employed.

The design entry tool 302 may include a graphic interface through which a designer connects symbols and blocks representing various components to produce a schematic description of the circuit design. The design entry tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

In one embodiment, the synthesis tool 304 is configured to receive the functional design data 306. The synthesis tool 304 processes the functional design data 306 to produce a logical design data 310. The logical design data 310 may include a logical network list ("netlist") supported by the target FPGA. For example, the synthesis tool 304 may process HDL code of the functional design data 306 to produce a netlist. The HDL synthesis process is well known in the art. In another embodiment, the design entry tool 304 produces the logical design data 310 directly. For example, the design entry tool 304 may produce a netlist for the target FPGA in response to a schematic description. As used herein, a "circuit representation" includes the functional design data 306, the logical design data 310, or both.

The implementation tool 312 is configured to receive the logical design data 310. The implementation tool 312 processes the logical design data 310 to produce physical design data 318 for the target FPGA device. The implementation tool 312 illustratively includes a mapping component 314 and a place-and-route (PAR) component 316. For example, the mapping component 314 maps the logical design data 310 onto primitive components within the target FPGA (e.g., CLBs, IOBs, etc.). The PAR component 316 places the primitive components within the target FPGA and routes interconnects (e.g., signal conductors of the programmable interconnect) for the placed components. The map/place/route process for and FPGA is well known in the art.

The back-annotation tool 326 is configured to receive the physical design data 318. The back-annotation tool 326 processes the physical design data 318 to produce a simulation model 328. The simulation model 328 may include a netlist having timing data associated with the particular implementation of the circuit design represented by the physical design data 318. Such a netlist may be referred to as a "back-annotated netlist." The timing data includes delay information, setup and hold times, clock information, pulse widths, and the like for the implemented circuit design. The timing data facilitates simulation of the circuit design by the simulation tool 336.

The simulation model 328 includes a hierarchy of nodes that represent the components of the implemented circuit design. Each of the nodes is associated with a particular tag. For a given node, the value of its tag may be the same as that of the component associated with the node (i.e., the tags in the simulation model 328 may be identical to the tags assigned by the design entry tool 304). Alternatively, the value of a tag for a given node may differ from that assigned by the design entry tool 304, but related to such tag in a predefined manner (i.e., the tags assigned by the design entry tool 304 may be mangled in a known manner such that they may be un-mangled using a predefined set of rules).

The bitstream generation tool 320 is configured to receive the physical design data 318. The bitstream generation tool 320 processes the physical design data 318 to produce bitstream data 322 for the target FPGA. The bitstream generation process is well known in the art. In addition, the bitstream generation tool 320 produces information on each component in the circuit design that can be captured for readback ("capture node data 324"). For example, the capture node data 324 may include tags for each component in the circuit design configured for readback capture. The tags in the capture node data 324 may correspond directly with the tags for the components assigned by the design entry tool 304, or may differ from such tags in a known manner.

For example, the bitstream generation tool 320 may comprise the BITGEN program, commercially available from Xilinx, Inc. of San Jose, Calif. The BITGEN program includes a command line option to produce an ".ll file". The ".ll file" is a text file that contains information on each of the nodes in the design that can be captured for readback. The text file contains the absolute bit position in the readback stream, frame address, frame offset, logic resource used, and name (i.e., tag) of the component in the design.

The test bench augmentation tool 330 is configured to receive the capture node data 324, the simulation model 328, and a test bench 332. The test bench 332 is configured to instantiate/initialize the circuit design represented by the simulation model 328 and apply a test stimulus 340 to the instantiated simulation model 328. For example, the test bench 332 may comprise HDL code. The test stimulus 340 is configured to exercise the instantiated simulation model using various input data over a sequence of clock cycles. The expected value 338 data is associated with the test stimulus 340. To generate the expected value data 338, the test bench 332 is augmented to record state data for nodes in the simulation model 328 that can be captured for readback. The test bench augmentation tool 310 processes the test bench 332 to produce augmented test bench data 334, as described below.

The simulation tool 336 is configured to receive the augmented test bench data 334 and the simulation model 328. The simulation tool 336 simulates the circuit design represented by the simulation model 328 in accordance with the augmented test bench data 334. The simulation tool 336 generates the expected value data 338 for the circuit design in accordance with the test stimulus 340. The expected value data 338 includes state data for nodes of interest in the simulation model 328 recorded over the duration of the test stimulus 340. The "nodes of interest" are nodes in the simulation model that can be captured for readback.

The test bench augmentation tool 330 identifies nodes in the simulation model 328 that correspond to the tags within the capture node data 324. In this manner, the test bench augmentation tool 330 automatically identifies the nodes in the simulation model 328 that can be captured for readback. In one embodiment, the tags associated with the nodes in the simulation model 328 are identical to the tags in the capture node data 324. In another embodiment, the tags associated with the nodes in the simulation model 328 differ from the tags in the capture node data 324 in a known manner. That is, the tags in the capture node data 324 may be associated with tags in the simulation model 328 using a predefined set of rules.

After identifying the nodes in the simulation model 328 that can be captured for readback, the test bench augmentation tool 330 augments the test bench 332 to record state data associated with the identified nodes during simulation by the simulation tool 336. In one embodiment, the test bench augmentation tool 330 inserts directives into the test bench 332 for recording the appropriate state data. For example, the test bench 332 may be written using VERILOG, and the directives may comprise "$strobe" statements.

Figure 6:
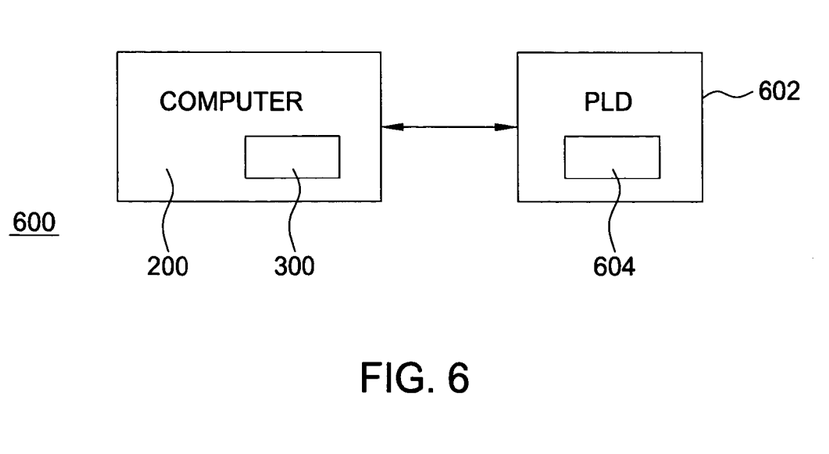
FIG. 6 is a block diagram depicting an exemplary embodiment of a system for testing a programmable logic device constructed in accordance with the invention.

After the expected value data 338 is generated, the bitstream data 322 may be loaded into the target FPGA and the test stimulus 340 may be physically applied to the circuit configured in the target FPGA. Notably, FIG. 6 is a block diagram depicting an exemplary embodiment of a system 600 for testing a PLD constructed in accordance with the invention. The system 600 includes the computer 200 and a PLD 602. The computer 200 implements the modeling system 300, as described above. A circuit 604 (i.e., test pattern) is configured in the PLD 602. State data for components of the configured circuit 604 that can be captured for readback 602 is extracted in response to a test stimulus. For example, after each clock of the test stimulus, the states of components in the configured circuit 604 are "captured" into unused configuration memory cells and "readback" using a conventional readback process. In another embodiment, a capture cell scan-chain may be explicitly configured in the PLD 602 as part of the configured circuit 604. The state data may then be read out through an interface of the scan-chain. In general, a component is configured for readback capture when state data associated with the component may be retrieved from the PLD. In any case, the modeling system 300 produces the expected value 338 data as describe above. The configured circuit 604 may be tested by comparing the captured state data with the expected value data 338.

Figure 4:
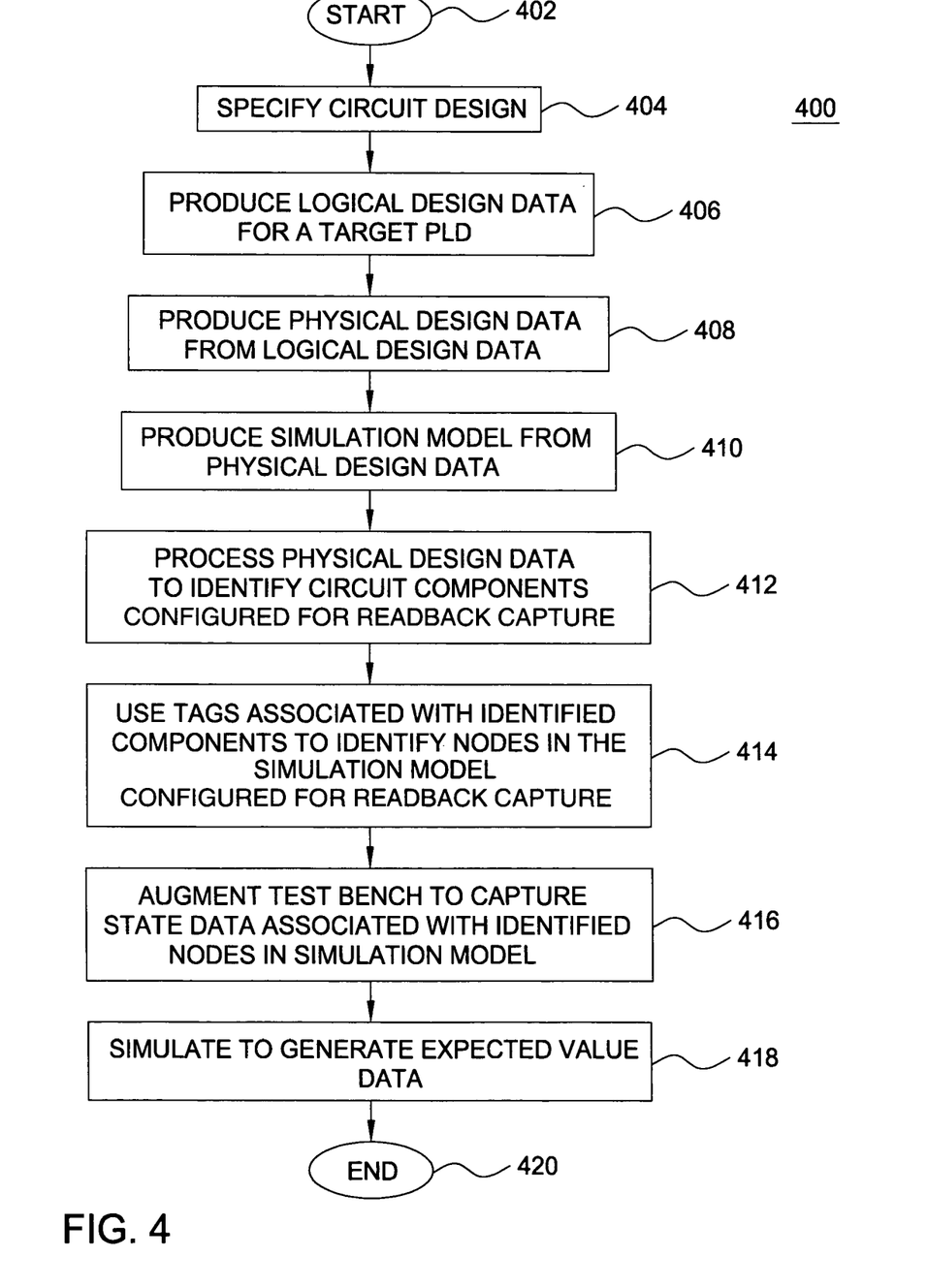
FIG. 4 is a flow diagram depicting an exemplary embodiment of a process for generating expected value data for testing a circuit design in accordance with the invention.

FIG. 4 is a flow diagram depicting an exemplary embodiment of a process 400 for generating expected value data for testing a circuit design in accordance with the invention. The process 400 begins at step 402. At step 404, a circuit design is specified. The circuit design may be specified using HDL or may be specified graphically using schematics. At step 406, the specified circuit design is processed to produce logical design data for a target PLD. The logical design data may comprise a netlist supported by the target PLD.

At step 408, the logical design data is processed to produce physical design data for the target PLD. For example, if the target PLD is an FPGA, the logical design data is mapped, placed, and routed with respect to the resources of the FPGA. At step 410, the physical design data is processed to produce a simulation model. In one embodiment, the simulation model comprises a back-annotated netlist for the specified circuit design. At step 412, the physical design data is processed to identify components of the circuit design that can be captured for readback.

At step 414, tags associated with the identified components are used to identify nodes in the simulation model that can be captured for readback. At step 416, a test bench is augmented to record state data associated with the identified simulation model nodes. At step 418, the circuit design associated with the simulation model is simulated to produce expected value data. The process ends at step 420.

Figure 5:
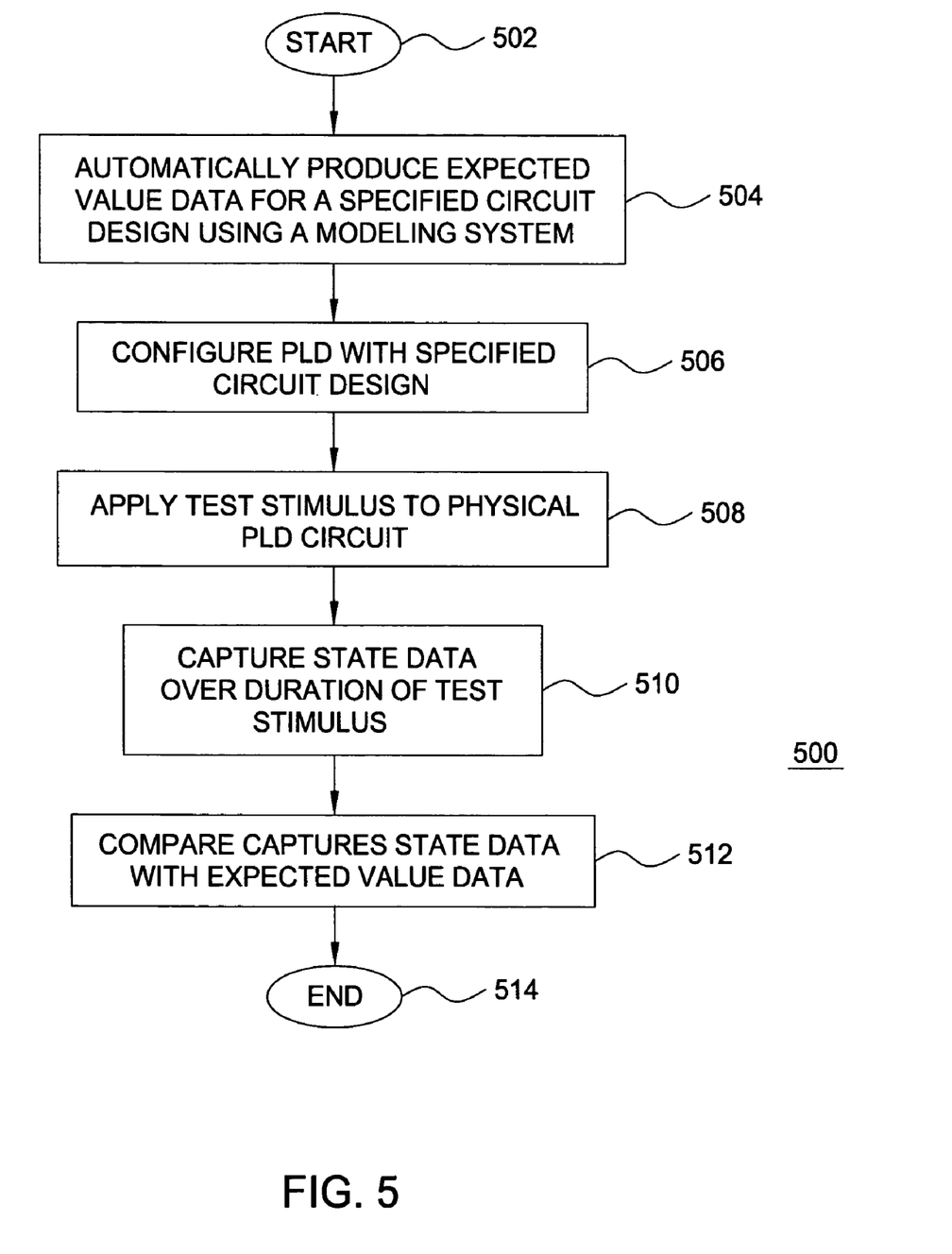
FIG. 5 is a flow diagram depicting an exemplary embodiment of a process for testing a circuit configured in a programmable logic device in accordance with the invention.

FIG. 5 is a flow diagram depicting an exemplary embodiment of a process 500 for testing a circuit configured in a PLD in accordance with the invention. The process 500 begins at step 502. At step 504, expected value data for a specified circuit design is automatically produced using a modeling system. Notably, the process 400 may be performed to generate expected value data for the specified circuit design. At step 506, the PLD is configured with a physical circuit in accordance with the specified circuit design. At step 508, a test stimulus is applied to the circuit configured in the PLD. At step 510, state data associated with the circuit is captured from the PLD over the duration of the test stimulus. For example, the state data may be obtained via a readback datastream of the PLD. At step 512, the captured state data is compared with the expected value data produced at step 504. The process 500 ends at step 514.

Method and apparatus for generating expected value data for nodes in a circuit design for a programmable logic device has been described. In one embodiment, the expected value data for a specified circuit design is automatically generated via simulation. Nodes in a simulation model that can be captured for readback in the PLD are automatically identified and a test bench is automatically modified to record state data for the identified nodes. In this manner, the invention allows a designer to specify more complex test patterns for the PLD than would otherwise be possible if the expected value data was generated by hand. Moreover, the invention allows a designer to localize faults with respect to a given test pattern, since state data for any node of interest in the test pattern may be captured and compared with the automatically generated expected value data. Thus, with the present invention, the designer is not restricted to monitoring only the outputs of a given test pattern.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of generating expected value data for testing a circuit configured in a programmable logic device, comprising:

generating a simulation model from a circuit representation for said circuit;

automatically identifying nodes in said simulation model configured for readback capture in said programmable logic device;

simulating said circuit representation as defined by said simulation model; and recording said expected value data during said simulation in response to said identified nodes.

2. The method of claim 1 wherein said step of generating said simulation model comprises:

producing logical design data for said programmable logic device to define said circuit representation;

processing said logical design data to produce physical design data for said programmable logic device; and translating said physical design data to define said simulation model.

3. The method of claim 2, wherein said step of processing said logical design data comprises:

implementing said logical design data using resources of said programmable logic device.

4. The method of claim 3, wherein said step of translating comprises:

generating a back-annotated netlist from said physical design data, said back-annotated netlist defining said simulation model.

5. The method of claim 2, wherein said simulation model comprises a netlist having timing data.

6. The method of claim 2, wherein said step of automatically identifying comprises:

processing said physical design data to identify components of said circuit representation configured for readback capture in said programmable logic device; and relating first tags associated with said identified components to second tags in said simulation model to identify said nodes.

7. The method of claim 6, wherein said step of processing said physical design data comprises:

generating bitstream for said programmable logic device from said physical design data; and generating said first tags in response to generation of said bitstream.

8. The method of claim 6, wherein said step of simulating comprises:

specifying a test bench for instantiating said simulation model; and applying a test stimulus to said test bench.

9. The method of claim 8, wherein said step of recording comprises:

inserting directives into said test bench for recording state data associated with said identified nodes, said state data defining said expected value data.

10. A method of generating expected value data for testing a circuit configured in a programmable logic device, comprising:

implementing a circuit representation of said circuit to produce physical design data;

generating back-annotated netlist from said physical design data;

generating a bitstream for said programmable logic device from said physical design data;

identifying components in said circuit representation configured for readback capture in said programmable logic device in response to generation of said bitstream;

identifying nodes in said back-annotated netlist associated with said identified components;

simulating said circuit representation as defined by said back-annotated net-list; and recording said expected value data during said simulation in response to said identified nodes.

11. The method of claim 10, wherein said step of simulating comprises:

specifying a test bench for instantiating said simulation model; and applying a test stimulus to said test bench.

12. The method of claim 11, wherein said step of recording comprises:

inserting directives into said test bench for recording state data associated with said identified nodes, said state data defining said expected value data.

13. A method for testing a circuit configured in a programmable logic device, comprising:

automatically generating expected value data for components of a circuit representation for said circuit using a modeling system, said components being configured for readback capture in said programmable logic device;

applying a test stimulus to said circuit;

capturing state data from said programmable logic device in response to said test stimulus utilizing said readback capture; and comparing said captured state data with said expected value data.

14. The method of claim 13, wherein said step of automatically generating comprises:

generating a simulation model from said circuit representation;

automatically identifying nodes in said simulation model associated with said components;

simulating said circuit representation as defined by said simulation model; and recording said expected value data during said simulation in response to said identified nodes.

15. The method of claim 14, wherein said simulation model comprises a back-annotated netlist.

16. The method of claim 13, wherein said state data is captured via a readback datastream produced by said programmable logic device.

17. Apparatus for generating expected value data for testing a circuit configured in a programmable logic device, comprising:

a design entry tool for generating a circuit representation for said circuit;

an implementation tool for generating physical design data from said circuit representation;

a back-annotation tool for generating a simulation model form said physical design data;

a bitstream generation tool for generating a bitstream for said programmable logic device in response to said physical design data and for identifying components in said circuit representation configured for readback capture in said programmable logic device in response to said bitstream;

an augmentation tool for identifying nodes in said simulation model associated with said identified components; and a simulation tool for simulating said circuit representation as defined by said simulation model and recording said expected value data during said simulation in response to said identified nodes.

18. The apparatus of claim 17, wherein said augmentation tool is configured to insert directives into a test bench for recording state data associated with said identified nodes, said state data defining said expected value data.

19. The apparatus of claim 18, wherein said simulation tool is configured to instantiate said simulation model using said test bench and apply a test stimulus to said test bench.

20. Apparatus for generating expected value data for testing a circuit configured in a programmable logic device, comprising:

means for generating a simulation model from a circuit representation for said circuit;

means for automatically identifying nodes in said simulation model configured for readback capture in said programmable logic device;

means for simulating said circuit representation as defined by said simulation model; and     means for recording said expected value data during said simulation in response to said identified nodes.

21. Apparatus for testing a circuit configured in a programmable logic device, comprising:

means for automatically generating expected value data for components of a circuit representation for said circuit using a modeling system, said components being configured for readback capture in said programmable logic device;

means for applying a test stimulus to said circuit;

means for capturing state data from said programmable logic device in response to said test stimulus utilizing said readback capture; and     means for comparing said captured state data with said expected value data.

\* \* \* \* \*